US 12,152,928 B2

(12) United States Patent
Feldotte et al.

(10) Patent No.: US 12,152,928 B2
(45) Date of Patent: Nov. 26, 2024

(54) GRAVIMETRIC MEASURING SYSTEM (71) Applicant: SARTORIUS LAB INSTRUMENTS GMBH & CO. KG, Goettingen (DE)

(72) Inventors: Heinrich Feldotte, Goettingen (DE); Michael Laubstein, Goettingen (DE); Heyko Holst, Goettingen (DE)

(73) Assignee: SARTORIUS LAB INSTRUMENTS GMBH & CO. KG, Goettingen (DE)

( * ) Notice: Subject to any disclaimer, the term of this patent is extended or adjusted under 35 U.S.C. 154(b) by 472 days.

(21) Appl. No.: 17/394,787

(22) Filed: Aug. 5, 2021

(65) Prior Publication Data
US 2021/0364343 A1 Nov. 25, 2021

Related U.S. Application Data

(63) Continuation of application No. PCT/EP2020/052679, filed on Feb. 4, 2020.

(30) Foreign Application Priority Data

Feb. 5, 2019 (DE) ................. 10 2019 102 805.1

(51) Int. Cl.
*G01G 21/28* (2006.01)
*G01G 23/48* (2006.01)
(Continued)

(52) U.S. Cl.
CPC ............. *G01G 23/48* (2013.01); *G01G 21/28* (2013.01); *H05K 5/02* (2013.01); *H05K 5/03* (2013.01); *H05K 7/1425* (2013.01); *H05K 7/18* (2013.01)

(58) Field of Classification Search
CPC .......... H05K 5/02; H05K 5/0034; H05K 5/03; H05K 7/1421; H05K 7/1425; H05K 7/18; G01G 21/28; G01G 21/286; G01G 23/48
See application file for complete search history.

(56) References Cited

U.S. PATENT DOCUMENTS 4,313,025 A * 1/1982 Grube, Jr. ................ H05K 5/03
220/555
6,134,615 A * 10/2000 Chari .................. H05K 7/1498
715/835
(Continued)

FOREIGN PATENT DOCUMENTS

CN 1487271 A 4/2004
CN 204679162 U 9/2015
(Continued)

OTHER PUBLICATIONS

Chinese Office Action with English translation, CN Application No. 202080008509.4, 15 pages.
(Continued)

*Primary Examiner* — Randy W Gibson
(74) *Attorney, Agent, or Firm* — Edell, Shapiro & Finnan, LLC (57) ABSTRACT

A gravimetric measuring system (10), includes a balance (12) with a weighing chamber (22) surrounded by a weighing chamber wall (23, 24, 26, 28); an electromechanical weighing system (181); an electronic control apparatus (36) for controlling the system operation according to algorithms stored in a memory (363) thereof; and a plurality of functional modules (14, 16) configured to be inserted into module receptacles (283) arranged on the weighing chamber wall (28). Each module receptacle (283) has a device-side identification interface component (30*a*); and each functional module has a corresponding module-side identification interface component (30*b*). The control apparatus (36) identifies each functional module (14, 16) inserted into a module receptacle (283), through interaction between the respective device-side and module-side identification interface components (30*a*, 30*b*) and selects one of a plurality of
(Continued)

operating routines according to algorithms stored in the memory.

10 Claims, 3 Drawing Sheets

(51) Int. Cl.
    *H05K 5/02*     (2006.01)
    *H05K 5/03*     (2006.01)
    *H05K 7/14*     (2006.01)
    *H05K 7/18*     (2006.01)

(56) References Cited

U.S. PATENT DOCUMENTS

| | | | |
|---|---|---|---|
| 6,951,989 B2* | 10/2005 | Nufer | G01G 23/00 |
| | | | 177/180 |
| 8,674,823 B1* | 3/2014 | Contario | G01R 19/145 |
| | | | 340/693.1 |
| 9,520,043 B1* | 12/2016 | Alshinnawi | G06F 13/4068 |
| 10,018,500 B2 | 7/2018 | Buehler et al. | |
| 10,061,097 B2* | 8/2018 | Morales | H05K 7/1494 |
| 10,393,570 B2 | 8/2019 | Esser et al. | |
| 10,642,321 B2* | 5/2020 | Aimone | H05K 7/1498 |
| 11,002,591 B2 | 5/2021 | Buchmann et al. | |
| 2003/0115929 A1 | 6/2003 | Luchinger et al. | |
| 2004/0079558 A1 | 4/2004 | Luchinger et al. | |
| 2004/0104055 A1 | 6/2004 | Nufer et al. | |
| 2011/0291813 A1* | 12/2011 | Jansma | H05K 7/1498 |
| | | | 340/10.5 |
| 2013/0264889 A1* | 10/2013 | Quittek | H04B 3/54 |
| | | | 324/649 |
| 2014/0015857 A1* | 1/2014 | Smith | G06F 3/048 |
| | | | 345/629 |
| 2015/0113296 A1* | 4/2015 | Slotten | G06F 1/189 |
| | | | 713/310 |
| 2015/0311649 A1* | 10/2015 | Horne | H01R 13/6691 |
| | | | 439/489 |
| 2016/0250628 A1 | 9/2016 | Graf et al. | |
| 2016/0252389 A1* | 9/2016 | Esser | H01L 21/67 |
| | | | 177/25.13 |
| 2021/0364341 A1* | 11/2021 | Staender | G01G 23/48 |
| 2021/0385960 A1* | 12/2021 | Horii | H05K 5/03 |

FOREIGN PATENT DOCUMENTS

| | | |
|---|---|---|
| CN | 105705914 A | 6/2016 |
| CN | 107830925 A | 3/2018 |
| DE | 102009055624 A1 | 5/2011 |
| DE | 102009055622 B4 | 8/2014 |
| DE | 102014101558 A1 | 5/2015 |
| DE | 102014101561 A1 | 5/2015 |
| EP | 1195584 A1 | 4/2002 |
| EP | 1312902 A1 | 5/2003 |
| EP | 1396711 B1 | 1/2006 |
| EP | 3557199 A1 | 10/2019 |
| JP | H0228522 A | 1/1990 |
| JP | 2586115 B2 | 2/1997 |

OTHER PUBLICATIONS

International Search Report, PCT/EP2020/052679, May 27, 2020, 6 pages.

* cited by examiner

GRAVIMETRIC MEASURING SYSTEM

CROSS REFERENCE TO RELATED APPLICATIONS

This is a Continuation of International Application PCT/EP2020/052679, which has an international filing date of Feb. 4, 2020, and which claims the priority of German Patent Application 10 2019 102 805.1, filed Feb. 5, 2019. The disclosures of both applications are incorporated in their respective entireties into the present Continuation by reference.

FIELD OF THE INVENTION

The invention relates to a gravimetric measuring system, comprising
a balance with a weighing chamber, surrounded by a weighing chamber wall, an electromechanical weighing system and an electronic control apparatus for controlling the system operation according to algorithms stored in the memory thereof as well as
a plurality of functional modules, which can be inserted, as necessary, into module receptacles, arranged on the weighing chamber wall.

BACKGROUND

Gravimetric measuring systems of this type are known from EP 1 195 584 A1.

Analytical and laboratory balances, in particular, those that work on the principle of electromagnetic compensation, are well known. In this case an electromechanical weighing system, i.e., a typically complex lever mechanism with an input-side load receptacle and an output-side plunger coil arrangement, is arranged in a weighing system chamber, which is intended to ensure a shielding that is as good as possible with respect to environmental influences. A carrier, connected to the load receptacle, projects into a normally adjacent weighing chamber, which is also largely shielded from the environment, in particular, by use of its weighing chamber wall. The weighing chamber wall usually consists of the weighing chamber base, the weighing chamber cover, weighing chamber side walls as well as a front and rear wall. The rear wall may often coincide with a wall of the weighing system chamber. One side wall or both side walls of the weighing chamber are often designed as movable draft shield elements. The cover and/or the front side may also contain, as a rule, closable access openings. The coupling of the carrier to the load receptacle of the weighing system usually passes through the rear wall or the base of the weighing chamber.

Furthermore, such balances always contain a control apparatus, which controls, in particular, the weighing sensor system and, in so doing, specifically controls the plunger coil arrangement of the weighing system. However, the control apparatuses of modern balances can be designed to be significantly more complex and, in particular, can provide different operating routines of the system operation. Such operating routines may relate to the control of the sensor system or a cooling apparatus, but may relate, as an alternative or in addition, to the control of certain auxiliary apparatuses in or on the weighing chamber. Purely by way of example, mention may be made here of a cooling apparatus, a draft shield controller, lifting apparatuses inside the weighing chamber, lighting apparatuses and the like.

It is known from the representative document, mentioned in the introduction, to make such auxiliary apparatuses incorporating a weighing function available in the form of modules, i.e., as modules relating to the weighing function—in short: functional modules—and to provide a rail-like holding apparatus in the weighing chamber, in particular, on the rear wall thereof. Such holding apparatus have various mechanical interfaces, to which functional modules, required in the specific individual case, can be attached in the respectively required position. In other words, such functional modules can be inserted, as required, into corresponding module receptacles on the weighing chamber wall. Such a modular system is particularly advantageous in laboratory environments, in which different weighing tasks have to be carried out using one and the same balance. The balance can then be assembled by the user himself in accordance with his specific requirement in his particular case. Even in cases, where the mechanical interfaces are designed in such a way that the user cannot swap modules, such modular systems are also advantageous for the manufacturer. Using the same balance base body as a starting point, it is possible to pre-assemble balances for different weighing tasks by selecting the functional modules inserted into the module receptacles. The number of special parts to be produced is drastically reduced, an aspect that leads to a significant cost cutting.

The problem with the concept, described above, is the fact that different modules introduce different heat capacities; or in the case of active modules, such as, for example, a light, a motor driven module, an ionizer or the like, a different heat output is introduced. However, weighing operations are known to be extremely temperature critical. Typically, the aim is to adapt the temperature of the entire weighing chamber exactly to the ambient temperature. However, concepts are also known, in which a specific temperature gradient is to be built up in the weighing chamber. One example that can be mentioned here is the German patent document DE 10 2009 055 622 B4. In any case, a change in the heat capacities or heat outputs in the weighing chamber will create problems with regard to controlling the temperature in the weighing chamber. Generalizing, it can be said that the problem of the known balance systems is to match the specifically selected operating routine with the specifically selected module constellation.

The post-published European patent document EP 3 557 199 A1 discloses a balance with a weighing chamber rear wall, which can be assembled from a plurality of wall elements. The height of this rear wall can be adapted to different draft shield heights; thus, weighing chambers of different heights can be constructed.

The European patent document EP 1 312 902 A1 discloses a balance, on the weighing chamber rear wall of which an electronic auxiliary unit, in which supply units, for example, a battery, or even an electronic control unit, can be arranged; consequently a functional module, as defined herein, can be attached. Consequently, the document does not make any reference to the associated problem of heat input into the weighing chamber.

The European patent document EP 1 396 711 B1 discloses a balance with a weighing chamber, which is equipped without any functional modules; and this balance dissipates the heat of the weighing electronics and out of the weighing chamber with a thermoelectric element, where in this case the special thermal coupling to the weighing chamber rear wall ensures the formation of a temperature gradient inside the weighing chamber.

The German patent document DE 10 2014 101 561 A1 discloses a gravimetric dosing apparatus with a climate measuring module arranged in the weighing chamber. Based on the climate data determined with said climate measuring module, the components, which are to be mixed in accordance with the dosing process, can be temperature-controlled beforehand outside the apparatus.

The German patent document DE 10 2009 055 624 A1 discloses a balance with weighing electronics, which are arranged in a housing substructure and which are shielded against, in particular, the weighing chamber with a thermal shielding plate, with the shielding plate being connected to the cooling side of a thermoelectric module.

A similar approach is used in the Japanese patent document JP 2 586 115 B2, where in this case the thermally shielded weighing electronics are located in a housing behind the weighing chamber.

SUMMARY

An object of the present invention is to further develop a balance system of the generic type such that it is easier and more reliable to find the necessary match between the selected operating routine and the selected module constellation in order to operate the system correctly.

This object is achieved by gravimetric measuring systems distinguishing over known systems in that each module receptacle has a device-side identification interface component and each functional module has a corresponding module-side identification interface component and that the control apparatus is designed to identify each functional module, inserted into a module receptacle, through interaction between the respective device-side and module-side identification interface components and to select one of a plurality of operating routines according to algorithms stored in the memory thereof.

Preferred embodiments are the subject matter of the dependent patent claims.

Thus, a primary aspect of the invention is the automatic detection of the specifically selected module constellation and, specially adapted thereto, the automatic selection of the appropriate operating routine. In this case the identification interface, required for this purpose, i.e., the combination of device-side and module-side identification interface component, can be designed in different ways. Conceivable is a mechanical interaction between a height profile as a module identification and a sensing apparatus, for example, in the form of micro switches, as the device-side identification interface component. The sensing device is then connected in a data-transmitting manner, in particular, electrically, to the control unit. An optical or magnetic sensor system can also be used as an identification interface; and it is also possible to implement radio-based identification interfaces, for example, based on a transponder or RFID. Such interfaces, the device-side components of which are installed on each module receptacle and the module-side components of which are installed on each module, can be used to detect both the number and the type of modules, which are installed in each case, and then to transmit this information to the control apparatus. Stored in the memory thereof are algorithms, on the basis of which a useful, adapted operating routine is selected, which is then used as a basis for the next phase of the system operation.

The adaptation of the operating routine to the respectively detected module constellation performed in the control apparatus may affect all of the variable aspects of the system operation. In particular, the temperature control in the weighing chamber can be affected. Thus, in a preferred embodiment of the invention it is provided that the balance has a cooling apparatus, which can be controlled by the control apparatus, for cooling the weighing chamber, and the control apparatus is programmed to control the cooling apparatus with a static cooling capacity, which is dependent on the type and number of the identified modules. In such an embodiment it is possible to dispense with a complex closed loop temperature control, for the most part. In particular, it has been found that if the balance is set up at a suitable installation site without excessive fluctuations in the environmental parameters, an aspect that is the typical case for laboratory balances, it suffices to operate the cooling apparatus with a static cooling capacity. However, the required static cooling capacity is a function of the specific module constellation. This applies to a particularly high degree to cases, where active modules, which introduce a positive heat output into the weighing chamber, are installed. Examples of this are lights, displays, ionizers, code scanners, motor driven elements, such as lifting apparatuses, etc. At the manufacturer the module-specific heat outputs are precisely known. In this case said heat outputs may be values that are specific to the type of module or even values that are specific to the individual module. Consequently at the manufacturer the associated heat output or rather the amount of cooling capacity that is required to compensate for said heat output and by which the static cooling capacity is increased as soon as the installation of the corresponding module has been detected, based on the identification interface, can be stored in the memory of the control apparatus for each conceivably installed module. Therefore, the adaptation of the temperature control is carried out through a static control of the cooling apparatus and does not need a complex closed loop control. It should be noted that, as a rule, it will also be necessary to provide a (likewise static) module-independent basic cooling capacity, which is supplied by the cooling apparatus even in those cases, in which no functional module or at least no active functional module is installed.

In this context the term "memory of the control apparatus" as well as the term "storage of algorithms and/or values in the memory" are to be understood in a broad sense. Accordingly, it includes local memories, whether it or they be on the device side or the module side. However, it can also refer to external memories, for example, a cloud or an external server. Thus, in the context of the present invention it should also be possible for the control apparatus to transmit the determined module constellation to an external unit, for example, over the internet, and from there to receive the specific information for selecting the appropriate operating routine. This embodiment of the invention has the advantage that information about newly developed modules needs only to be stored centrally and does not, for example, have to be updated via a firmware update, in each local control apparatus.

As explained, one advantage of the above-described static cooling capacity, which can be gradually adjusted as a function of the module, lies in the elimination of the need for a complex closed loop temperature control. However, this does not preclude a simple closed loop control. Thus, in a further development of said embodiment it can be provided that the control apparatus is further programmed to control the cooling apparatus additionally with a dynamic cooling capacity correction that is dependent on temporary environmental influences. In this way slight fluctuations in the ambient temperature of the balance can occur even at good temperature-controlled installation sites, for example, due to changing exposure to solar radiation. Of course, such fluctuations are not detected by an open loop control of the basic static cooling capacity. However, it is possible to compensate for such small fluctuations easily with a simple closed loop control of the cooling capacity correction, which is virtually superimposed on the open loop control of the static cooling capacity. This closed loop control of the cooling capacity correction can be designed independently of the module, since the module-dependent heat capacity or heat output contributions are already taken into account by the step-by-step open loop control of the static cooling capacity.

As an alternative to the step-by-step open loop control of the static cooling capacity, explained in detail above, it can be provided in another embodiment of the invention that the balance has a cooling apparatus, which can be controlled by the control apparatus, for cooling the weighing chamber; and the control apparatus is programmed to control the cooling apparatus in order to constantly maintain a predetermined weighing chamber temperature with a closed loop control, the control parameters of which are dependent on the type and number of the identified modules. For example, in the context of this adaptation of the closed loop control parameters it can be taken into account that when the cooling capacity changes, the optimum step size with respect to achieving a target temperature as quickly as possible can be dependent on the heat capacity or output of the object to be cooled, i.e., in particular, here on the number and type of the modules installed in the weighing chamber.

Other features and advantages of the invention will become apparent from the following specific description and the drawings.

DETAILED DESCRIPTION

Identical reference numerals and symbols in the figures indicate the same or analogous elements.

Figure 1:
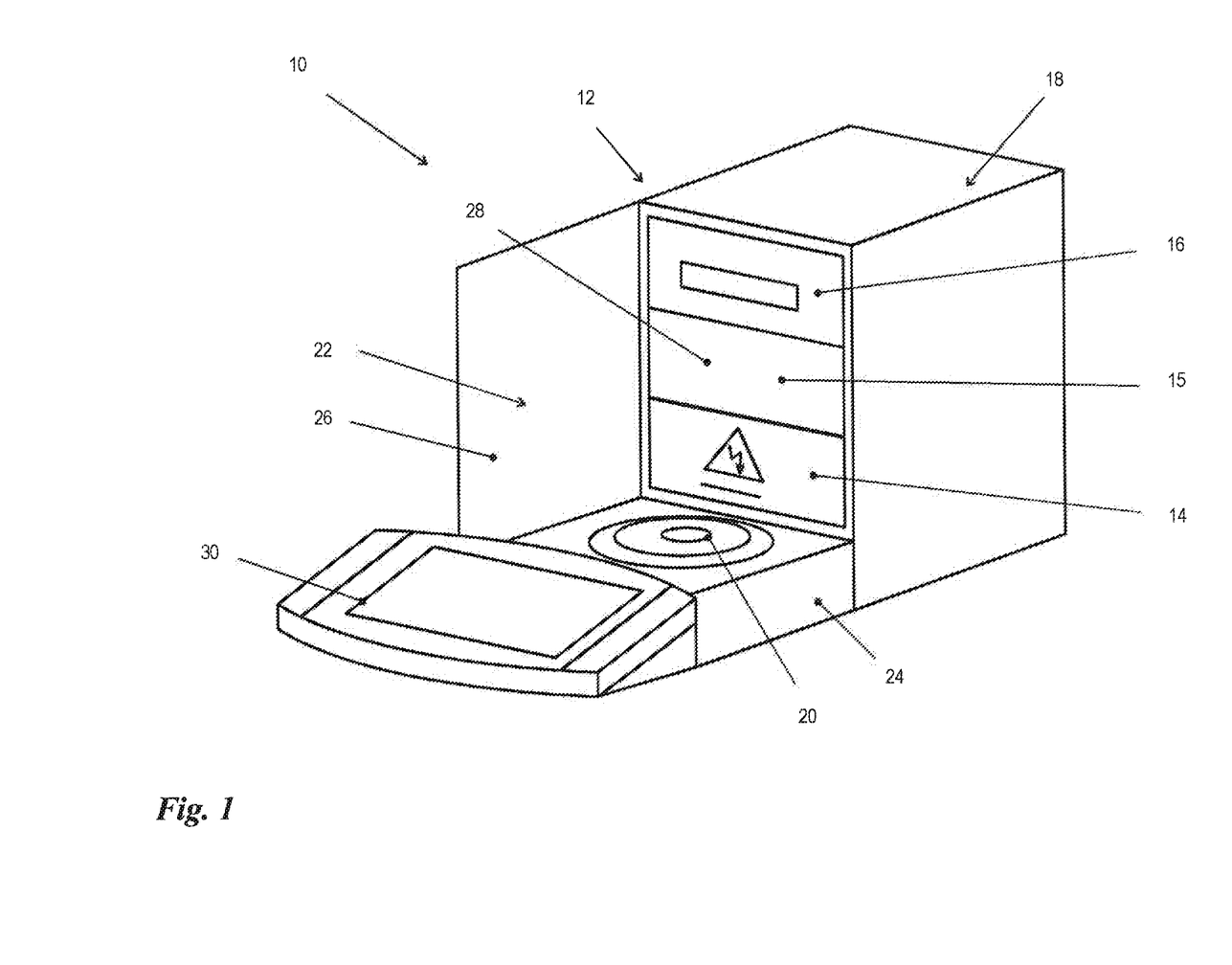
FIG. 1: a schematic representation of an inventive gravimetric measuring system in the final state of assembly with an incompletely illustrated weighing chamber wall.

FIG. 1 shows a schematic representation of an inventive gravimetric measuring system 10, which consists essentially of a balance 12 and two functional modules 14, 16, inserted therein, as well as a diaphragm 15. In the embodiment shown, the functional module, provided with the reference numeral 14, is a laser scanner unit, which is suitable for detecting bar codes; and the functional module, provided with the reference numeral 16, is a lighting unit. However, the specific functions of the functional modules 14, 16 play no role in the context of the present invention.

Figure 2:
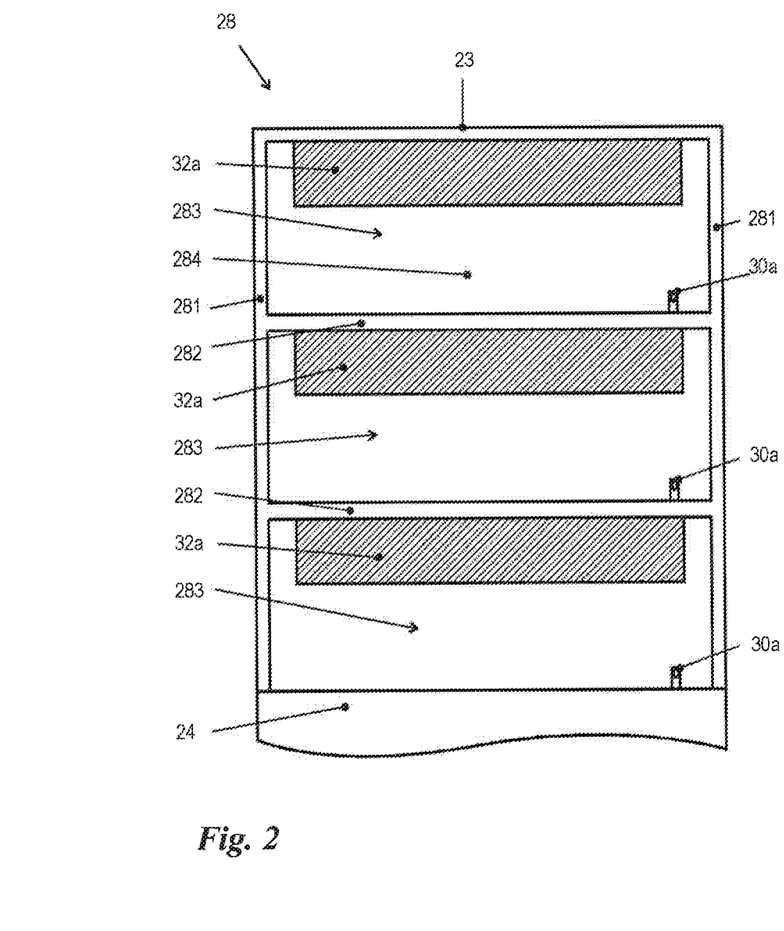
FIG. 2: the weighing chamber rear wall of the balance of the gravimetric measuring system from FIG. 1 in an intermediate state of assembly without inserted functional modules or diaphragms.
Figure 3:
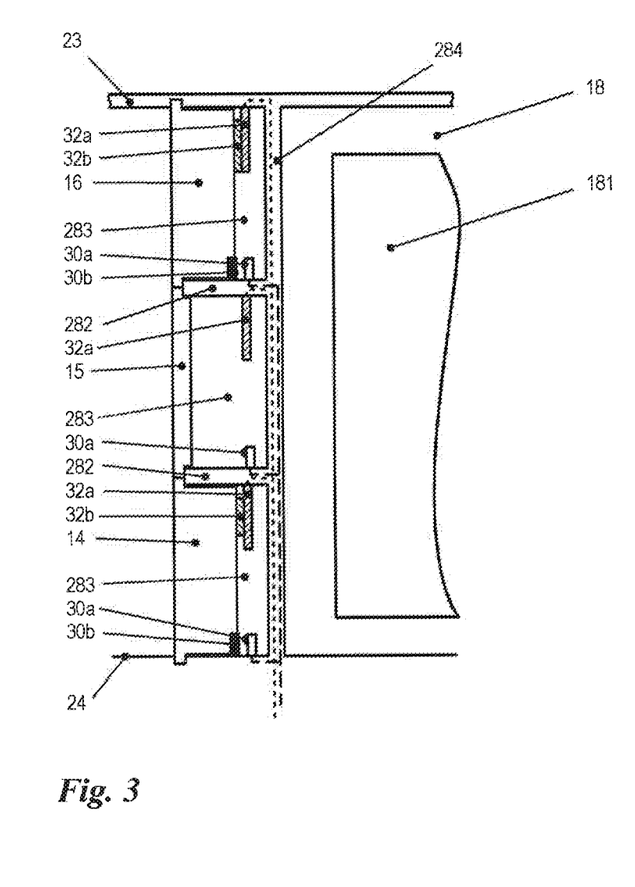
FIG. 3: an incomplete sectional view of the weighing chamber rear wall of the balance of the gravimetric measuring system from FIG. 1 and adjacent areas as well as FIG. 4: a schematic representation of a preferred cooling control of the balance of the gravimetric measuring system from FIG. 1.

In the embodiment shown, the balance 12 comprises essentially three regions, namely a weighing system chamber 18, in which a weighing system 181, indicated in FIG. 3, is arranged. The specific construction of the weighing system 181 does not play a role in the context of the present invention. In each case the weighing system 181 comprises a load receptacle (not shown separately), which is connected to a sample carrier 20, which in turn is arranged in a weighing chamber 22, adjoining the weighing system chamber 18 in the embodiment shown. The weighing chamber 22 is surrounded by a weighing chamber wall, which is shown only incompletely in FIG. 1. In particular, the weighing chamber base 24, through which the sample carrier 20 passes, a weighing chamber side wall 26 and a weighing chamber rear wall 28, all of which will be described in greater detail below, are illustrated. In the drawing shown in FIG. 1, the weighing chamber rear wall 28 is covered substantially by the front sides of the functional modules 14, 16 and the diaphragm 15, which is arranged between these functional modules 14, 16. Typically the weighing chamber wall also comprises an additional weighing chamber side wall, a weighing chamber front wall and a weighing chamber cover 23 (indicated only in FIGS. 2 and 3), but none of these are shown in FIG. 1 for reasons of better clarity.

Furthermore, the balance 12 comprises an electronic unit 30, which in the case of the embodiment shown comprises essentially a large format display. The electronic unit 30 can additionally contain a control apparatus, which will be explained in more detail below. However, this control apparatus can also be arranged at another location of the balance 12. It is considered to be advantageous if this control unit is arranged so as to be thermally insulated from the weighing system chamber 18 and from the weighing chamber 22.

FIG. 2 shows a frontal view of the weighing chamber rear wall 28, but without the inserted functional modules 14, 16 and without the diaphragm 15. FIG. 3 shows a sectional view of the weighing chamber rear wall 28 and adjoining regions of the balance 12. However, the drawing from FIG. 3 also shows the inserted functional modules 14, 16 and the inserted diaphragm 15. Despite this difference an integrated view of FIGS. 2 and 3 makes it easier to understand the following description.

The weighing chamber rear wall 28 is constructed of vertical posts 281 and struts 282, arranged transversely thereto. Between these, there extend recesses 283, which are also referred to herein as module receptacles 283. On the weighing system chamber side, the weighing chamber rear wall 28 has an end wall 284, which seals the weighing system chamber 18 and which prevents passage through the module receptacles 283 into the weighing system chamber 18. In the illustrated embodiment the end wall 284 is at the same time the front wall of the weighing system chamber 18.

The module receptacles 283 serve to house in a spatially adapted manner the functional modules 14, 16. The embodiment according to FIGS. 1 and 3 has no functional module inserted into the central module receptacle 283 depicted in FIGS. 2 and 3. Instead, this recess 283 between the posts 281 and struts 282 is closed off with the diaphragm 15 towards the weighing chamber. The module receptacles 283 are designed identically with respect to their configuration, as will be described in greater detail below, so that the functional modules 14, 16 can be inserted just like other, compatibly designed functional modules into each of the module receptacles 283. With regard to their size the module receptacles 283 are designed preferably identically, in particular so that they merge into each other, and preferably without a separating element. This permits the functional modules 14, 16, the size of which corresponds to an integral multiple of a unit size, can be inserted so as to fit exactly into one or more adjacent module receptacles 283. It is also feasible that the sizes of the module receptacles 283 themselves are different integer multiples of a unit size. The same comments made with respect to the functional modules 14, 16 also apply to the diaphragms 15.

Each module receptacle 283 has a device-side identification interface component 30a, which can interact with a corresponding module-side identification interface component 30b of an inserted functional module 14, 16, in order to identify the inserted functional module 14, 16 and to connect it to a control unit through a corresponding data line (dashed lines).

Figure 4:
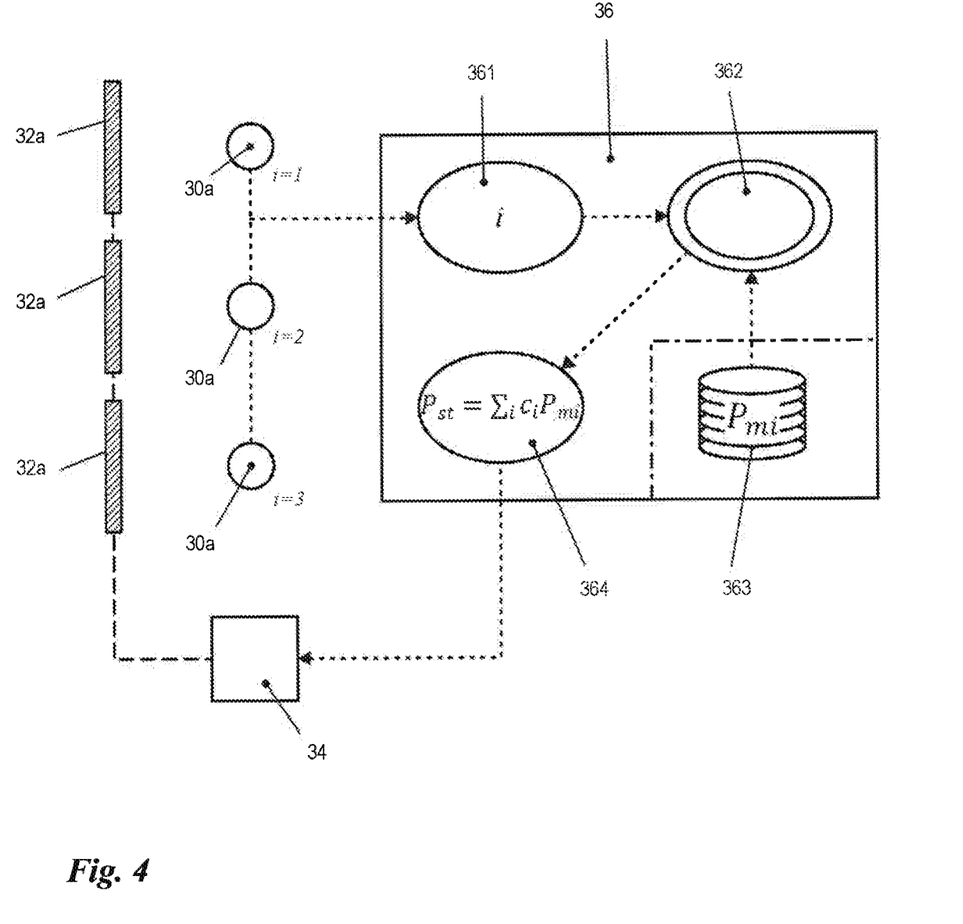

Furthermore, each module receptacle 283 has a device-side thermal interface component 32a, which is in thermal contact with a corresponding module-side thermal interface component 32b of an inserted functional module 14, 16. The device-side thermal interface components 32a are thermally connected (dotted lines) to one another and to a cooling apparatus 34, as depicted in FIG. 4. The device-side thermal interface components 32a are preferably metal plates (as shown by the conventional hatch pattern for metal material in FIGS. 2-4) arranged within the module receptacles 283. Each device-side thermal interface component 32a is positioned within the module receptacle 283 such that it can come into thermal contact with the module-side thermal interface component 32b of an inserted functional module 14, 16 (FIG. 3).

Although additional interfaces, such as, for example, electrical and data interfaces, for controlling the functional modules 14, 16 are preferably provided, they are not shown in the figures for the sake of clarity.

A special feature of the module-side thermal interface components 32b of the illustrated embodiment lies in the fact that in comparison to the device-side thermal interface components 32a, they have contact area sizes that are different from one another. All of the module-side thermal interface components 32b are smaller than or at most just as large as the device-side thermal interface components 32a that are identical to one another with respect to size. The specific size of the module-side contact areas depends on the heat output of the respective functional modules 14, 16. In particular, there may be a proportionality between the heat output and the size of the thermal contact area of the modules.

FIG. 4 shows a preferred embodiment of a control of the balance 12. Shown are the device-side thermal interface components 32a, which are thermally connected to one another and to a cooling apparatus 34, and the device-side identification interface components 30a, which are identified here in each case with the index i. The identification data, obtained through interaction between the device-side and module-side identification interface components 30a, b, are transmitted to a control apparatus 36, there, in particular, to the identification unit 361. In the embodiment shown in FIGS. 1 and 3, the identification interface i=1 would provide the information about the inserted lighting module 16. The identification interface i=2 would provide the information about the absence of an inserted functional module; and the identification interface i=3 would provide the information about the inserted laser scanner module 14. The identification can be carried out in a manner specific to the type of module or even in a manner specific to the individual module. The identification data are sent from the identification unit 361 to a central unit 362. The latter receives information about the specific heat outputs of the identified functional modules 14, 16 from a memory unit 363. As indicated by the dotted and dashed line, the memory unit 363 can be integrated in the control apparatus 36 or removed from it, for example, can be kept in a server, connected through the internet. However, this information can also be stored in a memory unit of the functional module itself. In particular, it can be provided that after the functional module has been produced, said functional module is run through an individual measurement of its heat output at the factory in the context of the quality control, the result of which measurement is then stored in the memory unit. A type-specific storage without individual measurement is also possible. In any case the storage of the information in the module itself combines the advantages of reducing the load on the balance control unit, the independence of external data sources and the possibility of customization.

From the identification data, on the one hand, and the heat output data, on the other hand, the central unit 362 calculates the default values for controlling the cooling apparatus 34; and then said default values are passed on to a cooling control unit 364, connected to the cooling apparatus. In the illustrated embodiment the predetermined cooling capacity $P_{st}$ corresponds to a static cooling capacity, which is derived from the sum of the individual heat outputs $P_{mi}$ of the identified functional modules 14, 16, in each case multiplied by a weighting factor $c_i$, combined: $P_{st}=\Sigma_I c_i P_{mi}$. In this case the total cooling capacity P is obtained as a sum of a module-independent basic cooling capacity $P_0$ (not mentioned in FIG. 4) and the module-dependent static cooling capacity $P_{st}$: $P=P_0+P_{st}+P_v$.

The weighting factor $c_i$ can be used, for example, to take into account the specific position, i.e., the specific module receptacle, in which a functional module 14, 16 is inserted. Of course, such a weighting can also be dispensed with; in other words, the weighting factor corresponds then to 1 or is identical in all summands.

This static cooling capacity $P_{st}$ is uniformly distributed from the cooling apparatus 34 to all of the device-side thermal interface components 32a. The respective, requirement-specific distribution to the functional modules 14, 16 takes place by in response to the different sizes of the module-side thermal interface components 32b.

In a further development of this cooling control, the static cooling capacity $P_{st}$ forms only one of a plurality of terms of the total cooling capacity P: $P=P_0+P_{st}+P_v$, where $P_v=P_v(T)$. In this embodiment, in addition to the static cooling capacity $P_{st}$, there is also provided a small, regulated cooling capacity contribution, the cooling capacity correction $P_v$, with which it is possible to compensate for small fluctuations of the temperature T in the weighing chamber 22.

The embodiments, discussed in the specific description and shown in the figures, represent only illustrative exemplary embodiments of the present invention. In light of the disclosure herein, the person skilled in the art is given a broad spectrum of possible variations. In particular, it is possible, as an alternative or in addition to the weighing chamber rear wall 28, to design one or more of the remaining walls of the weighing chamber wall in the manner described as a post/strut structure with recesses designed as module receptacles. In such cases, in which the module receptacles do not adjoin a chamber to be sealed, in particular, for reasons of calibration, a special sealing wall, as in the embodiment shown here, is not necessary.

LIST OF REFERENCE NUMERALS AND SYMBOLS 10 gravimetric measurement system
12 balance
14 functional module
15 diaphragm
16 functional module 18 weighing system chamber
181 weighing system
20 sample carrier
22 weighing chamber
23 weighing chamber cover
24 weighing chamber base
26 weighing chamber side wall
28 weighing chamber rear wall
281 post
282 strut
283 recess/module receptacle
284 end wall
30a/b device-side/module-side identification interface component
32a/b device-side/module-side thermal interface component
34 cooling apparatus
36 control apparatus
361 identification unit
362 central unit
363 memory unit
364 cooling control unit
P total cooling capacity
$P_0$ basic cooling capacity
$P_{st}$ static cooling capacity
$P_v$ cooling capacity correction
$c_i$ weighting factor
$P_{mi}$ module-specific heat output
T temperature (in the weighing chamber)

What is claimed is:

1. A gravimetric measuring system, comprising:
a balance having a weighing chamber surrounded by a plurality of weighing chamber walls, wherein at least one of the weighing chamber walls comprises a plurality of recesses defining module receptacles;
an electromechanical weighing system;
an electronic control apparatus for controlling the electromechanical weighing system operation according to algorithms stored in a memory of the electronic control apparatus; and
a plurality of functional modules configured for insertion into the recesses defining the module receptacles,
wherein each of the recesses defining the module receptacles has a device-side identification interface component arranged therein and each of the functional modules has a corresponding module-side identification interface component arranged thereon,
wherein the module-side identification interface component, upon insertion of each functional module into respective recesses defining the module receptacles, either mechanically or magnetically interacts with the respective device-side identification interface component to provide information on type and number of functional modules that are inserted into the recesses defining the module receptacles, and transmit the information to the control apparatus,
wherein the control apparatus is programmed to identify each functional module, inserted into the recesses defining the module receptacles, through the interaction between the respective device-side and module-side identification interface components and to select given ones of a plurality of operating routines according to algorithms stored in the memory,
wherein the balance comprises a cooling apparatus programmed to be controlled by the control apparatus for cooling the weighing chamber, and
wherein the control apparatus is configured and programmed to:
a) control the cooling apparatus with a static cooling capacity ($P_{st}$) that is dependent on a type and number of the functional modules that generate heat during operation and are identified through the interaction of the respective device-side and module-side identification interface components, or
b) control the cooling apparatus through a closed loop control having control parameters which are dependent on the type and number of the identified functional modules that generate the heat during the operation in order to constantly maintain a predetermined weighing chamber temperature (T).

2. The gravimetric measuring system as claimed in claim 1,
wherein, when the control apparatus controls the cooling apparatus in accordance with a), the control apparatus additionally controls the cooling apparatus with a dynamic cooling capacity correction ($P_v$), which is dependent on temporary environmental influences.

3. The gravimetric measuring system as claimed in claim 1,
wherein each of the recesses defining the module receptacles comprises a device-side thermal interface component arranged therein that is in thermal contact with a corresponding module-side thermal interface component arranged on an inserted functional module upon insertion of the functional module into the module receptacle, and
wherein the device-side thermal interface components are thermally connected to one another and to the cooling apparatus.

4. The gravimetric measuring system as claimed in claim 3,
wherein each of the device-side thermal interface components have has a device-side contact area and the respective device-side contact areas are identical to one another with respect to size, and
wherein each of the module-side thermal interface components has a module-side contact area and the respective module-side contact areas vary in size between respective ones of the functional modules.

5. The gravimetric measuring system as claimed in claim 4, wherein the size of the contact area of each respective module-side thermal interface component is proportional to the heat generated by the respective functional module.

6. The gravimetric measuring system as claimed in claim 1,
wherein each of the module receptacles comprises a device-side thermal interface component arranged therein which is in thermal contact with a corresponding module-side thermal interface component arranged on an inserted functional module, and
wherein the module-side thermal interface component includes a contact area which has a size proportional to the heat generated by the inserted functional module during operation.

7. A gravimetric measuring system, comprising:
a balance with a weighing chamber surrounded by a weighing chamber wall;
an electromechanical weighing system;
an electronic control apparatus for controlling the electromechanical weighing system operation according to algorithms stored in a memory of the electronic control apparatus; and a plurality of functional modules configured for insertion into respective module receptacles arranged on the weighing chamber wall, wherein each of the module receptacles has a device-side identification interface component arranged therein and each of the functional modules has a corresponding module-side identification interface component arranged thereon, wherein the module-side identification interface component, upon insertion of each functional module into respective module receptacles, either mechanically or magnetically interacts with the respective device-side identification interface component to provide information on type and number of functional modules that are inserted into the module receptacles, and transmit the information to the control apparatus, wherein the control apparatus is programmed to identify each functional module, inserted into the module receptacles, through interaction between the respective device-side and module-side identification interface components and to select given ones of a plurality of operating routines according to algorithms stored in the memory, wherein the balance comprises a cooling apparatus programmed to be controlled by the control apparatus for cooling the weighing chamber, wherein the control apparatus is configured and programmed to:
  a) control the cooling apparatus with a static cooling capacity ($P_{st}$) that is dependent on a type and number of the functional modules that generate heat during operation and are identified through the interaction of the respective device-side and module-side identification interface components, and
  b) control the cooling apparatus through a closed loop control to constantly maintain a predetermined weighing chamber temperature (T), the closed loop control having control parameters which are dependent on the type and number of the identified functional modules that generate the heat during the operation, and wherein the static cooling capacity ($P_{st}$) in accordance with a) is derived from a sum of individual heat outputs ($P_{mi}$) of the functional modules identified by the control apparatus upon insertion of the functional modules into the module receptacles.

8. The gravimetric measuring system as claimed in claim 7,
wherein, when the control apparatus controls the cooling apparatus in accordance with a), the control apparatus additionally controls the cooling apparatus with a dynamic cooling capacity correction ($P_v$), which is dependent on temporary environmental influences.

9. The gravimetric measuring system as claimed in claim 1,
wherein the at least one weighing chamber wall is a rear weighing chamber wall constructed as a post and strut structure comprising vertical posts and transversely arranged struts, and
wherein the plurality of recesses defining the module receptacles extend between the posts and struts.

10. A gravimetric measuring system, comprising:
a balance having a weighing chamber surrounded by a plurality of weighing chamber walls, wherein at least one of the weighing chamber walls is constructed as a post and struct structure comprising vertical posts and struts arranged transversely to the posts, and a plurality of recesses defining module receptacles extending between the posts and struts;
an electromechanical weighing system;
an electronic control apparatus for controlling the electromechanical weighing system operation according to algorithms stored in a memory of the electronic control apparatus; and
a plurality of functional modules configured for insertion into the recesses defining the module receptacles,
wherein each of the recesses defining the module receptacles has a device-side identification interface component arranged therein and each of the functional modules has a corresponding module-side identification interface component arranged thereon,
wherein the control apparatus is programmed to identify each functional module, inserted into the recesses defining the module receptacles, through interaction between the respective device-side and module-side identification interface components and to select given ones of a plurality of operating routines according to algorithms stored in the memory,
wherein the balance comprises a cooling apparatus programmed to be controlled by the control apparatus for cooling the weighing chamber, and
wherein the control apparatus is configured and programmed to:
  a) control the cooling apparatus with a static cooling capacity ($P_{st}$) that is dependent on a type and number of the functional modules that generate heat during operation and are identified through the interaction of the respective device-side and module-side identification interface components, and
  b) control the cooling apparatus through a closed loop control having control parameters which are dependent on the type and number of the identified functional modules that generate the heat during the operation in order to constantly maintain a predetermined weighing chamber temperature (T).

* * * * *